United States Patent
Pronko

Patent Number: 5,136,344
Date of Patent: Aug. 4, 1992

[54] HIGH ENERGY ION IMPLANTED SILICON ON INSULATOR STRUCTURE

[75] Inventor: Peter P. Pronko, Kettering, Ohio

[73] Assignee: Universal Energy Systems, Inc., Dayton, Ohio

[21] Appl. No.: 618,009

[22] Filed: Nov. 26, 1990

Related U.S. Application Data

[63] Continuation of Ser. No. 266,444, Nov. 2, 1988, abandoned.

[51] Int. Cl.$^5$ .............................................. H01L 27/12
[52] U.S. Cl. ........................................ 357/4; 357/23.7; 156/628; 156/630
[58] Field of Search ............... 156/628, 630; 357/23.7, 357/4; 437/21

[56] References Cited

U.S. PATENT DOCUMENTS

| | | | |
|---|---|---|---|
| 3,642,593 | 2/1972 | Meek | 204/143 |
| 3,682,729 | 8/1972 | Gukelberger, Jr. et al. | 156/13 |
| 3,721,539 | 3/1973 | Hays et al. | 156/17 |
| 3,721,588 | 3/1973 | Hays | 148/175 |
| 3,738,880 | 6/1973 | Laker | 156/17 |
| 3,751,314 | 8/1973 | Rankel | 156/17 |
| 3,933,530 | 1/1976 | Mueller et al. | 148/1.5 |
| 3,969,168 | 7/1976 | Kuhn | 156/17 |
| 3,980,507 | 9/1976 | Carley | 148/187 |
| 4,057,895 | 11/1977 | Ghezzo | 29/591 |
| 4,092,209 | 5/1978 | Ipri | 156/628 |
| 4,108,715 | 11/1978 | Ishikawa et al. | 156/628 |
| 4,131,985 | 1/1979 | Greenwood et al. | 29/580 |
| 4,234,361 | 11/1980 | Guckel et al. | 148/186 |
| 4,278,476 | 7/1981 | Bartko et al. | 148/1.5 |
| 4,347,654 | 9/1982 | Allen et la. | 29/576 B |
| 4,394,211 | 7/1983 | Uchiyama et al. | 156/628 |
| 4,438,556 | 3/1984 | Komatsu et al. | 29/576 B |
| 4,450,041 | 5/1984 | Aklufi | 156/628 |
| 4,451,326 | 5/1984 | Gwozdz | 156/643 |
| 4,455,192 | 6/1984 | Lamai | 156/628 |
| 4,532,700 | 8/1985 | Kinney et al. | 29/576 |
| 4,545,113 | 10/1985 | Vora | 29/578 |
| 4,560,421 | 12/1985 | Maeda et al. | 148/1.5 |
| 4,573,257 | 3/1986 | Hulseweh | 29/576 |
| 4,601,779 | 7/1986 | Abernathey et al. | 156/628 |
| 4,634,473 | 1/1987 | Swartz et al. | 148/1.5 |
| 4,634,494 | 1/1987 | Taji et al. | 156/628 |
| 4,637,836 | 1/1987 | Flatley et al. | 148/1.5 |
| 4,664,746 | 5/1987 | Hackleman et al. | 156/628 |
| 4,685,996 | 8/1987 | Busta et al. | 156/628 |
| 4,749,660 | 6/1988 | Short et al. | 437/24 |
| 4,771,016 | 9/1988 | Bajor et al. | 437/21 |
| 4,826,787 | 5/1989 | Muto et al. | 437/208 |
| 5,024,723 | 6/1991 | Goesele et al. | 156/628 |

OTHER PUBLICATIONS

Ghandi, *VLSI Fabrication Principles: Silicon and Gallium Arsenide*, p. 28.

Primary Examiner—Andrew J. James
Assistant Examiner—Courtney A. Bowers
Attorney, Agent, or Firm—Reinhart, Boerner, Van Deuren, Norris & Rieselbach

[57] ABSTRACT

A silicon on insulator structure and method of making the structure. A high purity, substantially defect free silicon wafer is the basis for forming a final thin silicon layer on an insulator layer, the silicon having substantially the same chemical and structural state as the starting silicon wafer. Dopant atoms of MeV energy range are implanted into the silicon wafer, the silicon wafer haivng an insulator layer coupled thereto; and an underlying silicon carrier wafer is coupled to the insulator. The implanted silicon wafer undergoes preferential etch stop removal of the silicon up to the implanted dopant layer, followed by selective removal of the dopant atom layer, leaving the desired high quality silicon layer on an insulator substrate.

10 Claims, 3 Drawing Sheets

HIGH ENERGY ION IMPLANTED SILICON ON INSULATOR STRUCTURE

This is a continuation of copending application Ser. No. 07/266,444 filed on Nov. 2, 1988 now abandoned.

The present invention is related generally to an improved silicon on insulator structure. More particularly, the invention is related to a high quality, defect free silicon disposed on an insulator substrate with the active silicon layer produced through the use of a high energy ion beam implantation procedure. These processes may be used with or without a pre or post deposited epitaxial silicon layer. It is especially suited to an epiless process.

For a period of at least ten years, the semiconductor industry has carried out research and development of silicon on insulator technology with the expectation of being able to construct high performance integrated circuits. Unfortunately, numerous obstacles have prevented development of suitable silicon on insulator structures which have the level of perfection and active layer characteristics sufficient to enable constructing such high performance integrated circuits. For example, in the case of silicon on sapphire a hetero-epitaxy process is used and substantial crystalline imperfections and high charge density characteristics exist at the sapphire/silicon interface. Moreover, epitaxial processes often result in nonuniform layer thicknesses (varying ±0.04 microns) which prevents the desired formation of relatively thin layers (0.1 microns or less) of high quality silicon. There are even methods using medium energy ion implantation, but these methods involve epitaxial layer formation with its complexities and complications (see U.S. Pat. No. 4,601,779).

The level of quality of such silicon produced by hetero-epitaxy can be improved somewhat by various measures, such as, (a) using solid phase epitaxy of silicon following amorphization implantation or (b) a depletion-limiting charge can be implanted at the interface to diminish the unwanted high charge density problem; however, the ion beam straggle resulting from implantation prevents the formation of a thin active silicon region. In the case of silicon implanted oxide structures some improvement of silicon properties can be obtained, but such structures require the use of sophisticated high beam current implantation units and which allow good control of sputtering characteristics. Even with the use of repetitive implantation-annealing schedules or the annealing of the silicon at temperatures near the melting point, there is substantial threading dislocation density remaining (typically greater than about $10^5/cm.^2$). This level of defects does not permit manufacturing the desired high performance integrated circuits. Even when the above cited remedial measures are used, the resulting structure still exhibits inadequate electrical properties for the interfacial regions discussed above. There is therefore a substantial need for improvement in the methods of preparation and the structure of silicon on insulator configurations to be used for high performance integrated circuits.

BRIEF SUMMARY OF THE INVENTION

It is therefore an object of the invention to provide an improved silicon on insulator structure and a method of making the structure.

It is an additional object of the invention to provide a novel silicon on insulator structure having a high quality, substantially defect free silicon layer on the insulator.

It is another object of the invention to provide an improved silicon on insulator structure with substantially defect free active silicon layers formed from a silicon substrate implanted with MeV range ions followed by various etch stop techniques for removing precise thicknesses of silicon.

It is a further object of the invention to provide an improved silicon on insulator structure without resorting to epitaxial deposition of silicon layers.

A feature of the silicon on insulator structure in accordance with the invention lies in the formation of a structure with a substantially defect free silicon layer including an embedded etch stop layer formed by MeV range energy ion implantation. The etch stop layer enables removal of a well defined portion of the silicon followed by selective removal of the ion implanted layer, leaving a high quality silicon active layer. The process utilized to obtain this high quality structure overcomes significant drawbacks of current methodologies and enables efficient commercial production of the high quality structure needed for manufacturing high performance integrated circuits.

Further objects and advantages of the present invention, together with the organization and manner of operation thereof, will become apparent in the following detailed description of the invention when taken in conjunction with the accompanying drawings.

DESCRIPTION OF PREFERRED EMBODIMENTS

Figure 1:
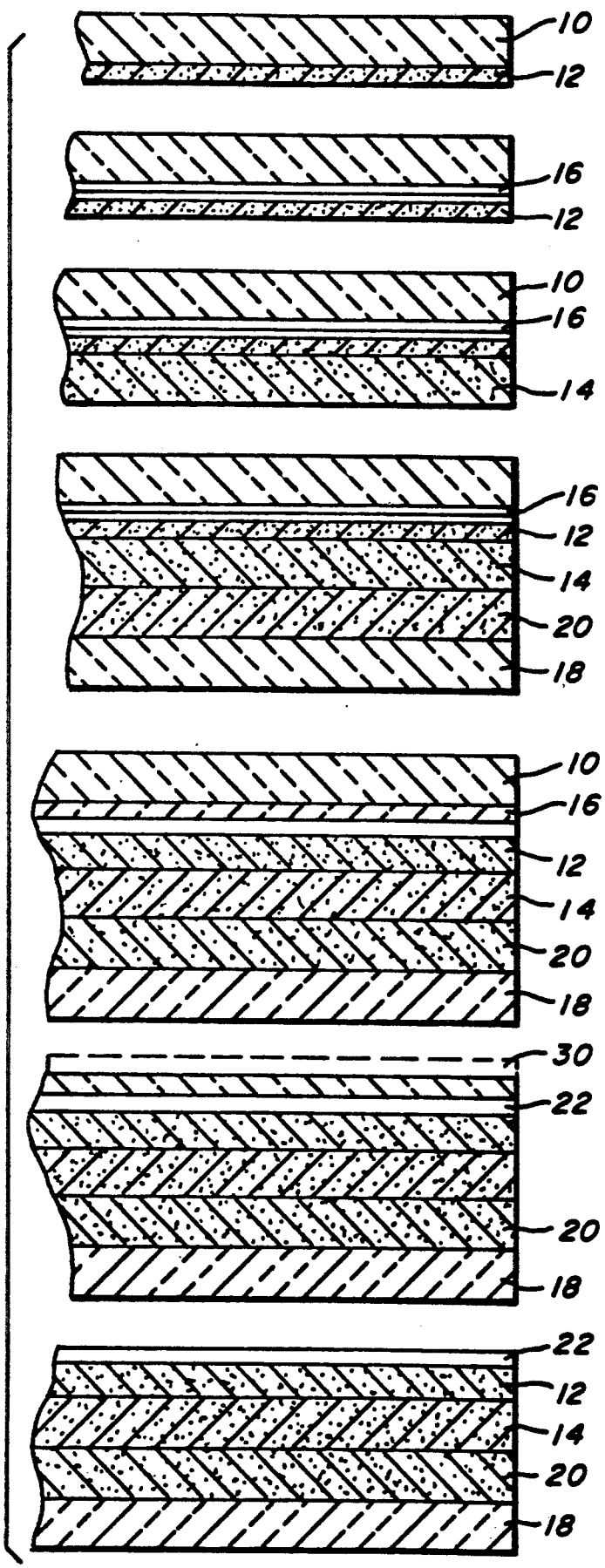
FIG. 1 shows the steps in a preferred method of preparing the silicon on insulator structure.

Preparation of the silicon on insulator structure begin with a wafer of silicon substrate material 10 shown in FIG. 1. The starting silicon substrate material 10 can be, for example, a one millimeter diameter wafer having a <100> orientation. The silicon wafer can be an n-type silicon single crystal and phosphorus doped to about $5 \times 10^{16}/cm^3$ with low oxygen and carbon contamination current (less than about fourteen parts per million oxygen for defect free active silicon layers and less than about 0.5 parts per million of carbon). Typical dislocation density is less than two hundred per silicon wafer. Such starting silicon substrate material 10 is conventional and readily available from numerous semiconductor materials suppliers.

Although not required, it is preferable that the starting silicon substrate material 10 is subjected to a conventional thermal oxidation step prior to ion implantation. This thermal oxidation step produces a quality oxide 12 which assists in preventing formation of implantation induced stacking faults. These stacking faults could be generated if a thermal oxidation step were implemented after ion implantation. This quality oxide 12 also seals the silicon interface prior to forming a first insulator layer, such as a thicker deposited first oxide 14 (hereinafter, the first oxide 14). Other advantages of the quality oxide 12 include prevention of contamination of the underlying silicon material 10, such as by deposition of low energy sputtered contaminants during ion implantation. Regarding formation of the first oxide 14, it can be generated, for example, by a chemical vapor deposition (hereinafter, CVD) technique. Typical thickness of the first oxide 14 is about 0.5 to 2 micrometers. The CVD method is a conventional and preferred approach for an insulator oxide since the resulting first oxide 14 enables maintaining a narrow implanted boron p+ profile in the silicon substrate material 10.

After forming the quality oxide 12, but before forming the first oxide 14, the cleaned silicon substrate material 10 is implanted with MeV energy range dopant atoms (such as boron, phosphorus, and arsenic or other appropriate extrinsic semiconductor dopant atoms) with Peak concentrations achieving at least the threshold for enabling use of an etch back, or etch stop, phenomenon. The etch back phenomenon is a conventional technique used to prevent etching from proceeding beyond a desired boundary region (see, for example, U.S. Pat. Nos. 4,560,421 and 4,394,211 which are incorporated by reference herein). In the illustrated embodiment the presence of selectively doped layers, such as an implanted layer 16 (boron in the preferred embodiment), in the silicon substrate material 10, acts as a barrier to further chemical etching of the silicon substrate material 10. A typical boron concentration in the preferred embodiments is approximately $5 \times 10^{19}/cm^3$ to establish the etch back character for the implanted layer 16. A dose level of $10^{15}/cm^2$ corresponds to a dopant concentration of about $7 \times 10^{19}/cm^3$ and would equate to about four hours implant time on a one hundred mm$^2$ wafer using a one microamp beam current. In a production system thirty of the one hundred millimeter wafers can be processed in one hour by using a beam current of about two hundred microamperes. Apparatus to carry out this process are currently available, and larger beam current equipment is now being introduced into the market enabling greater throughput in the very near future.

Figure 2:
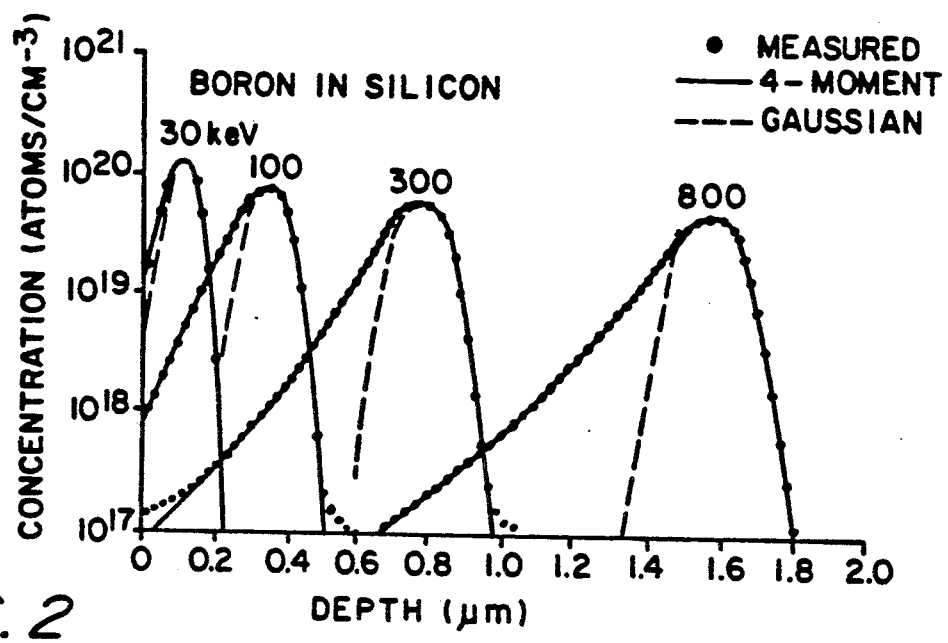
FIG. 2 illustrates the measured and calculated implanted boron atom distribution in silicon for various boron ion energies.

The ion beam energy necessary to achieve the desired etch back layer depth and profile varies depending on the dopant chosen to establish the ion implanted layer 16. The depth and profile breadth should be sufficient to permit use of the etch back technique to enable removal of substantially all of the defective portion of the silicon substrate material 10. In the case of B$^{11}$, the small mass number results in a relatively large ion range into the silicon substrate material 10 (see FIG. 2). For the preferred embodiment a boron ion energy of 1 MeV would easily allow formation of the desired profile and depth for the boron ion implanted layer 16. As shown in FIG. 2 the dopant level, even for 0.8 MeV implantation energies, decreases to concentrations below about $5 \times 10^{16}/cm^3$ for depth values less than 0.5 micrometers. Consequently, the silicon material 10 appears in effect to be "undoped" as far as a subsequent device fabrication is concerned. Typical threshold concentrations are about $10^{17}/cm^3$ for micron sized and submicron sized design fabrication formats. The implanted dopant concentration can be independently characterized by conventional techniques, such as, lateral capacitance measurements.

Figure 3:
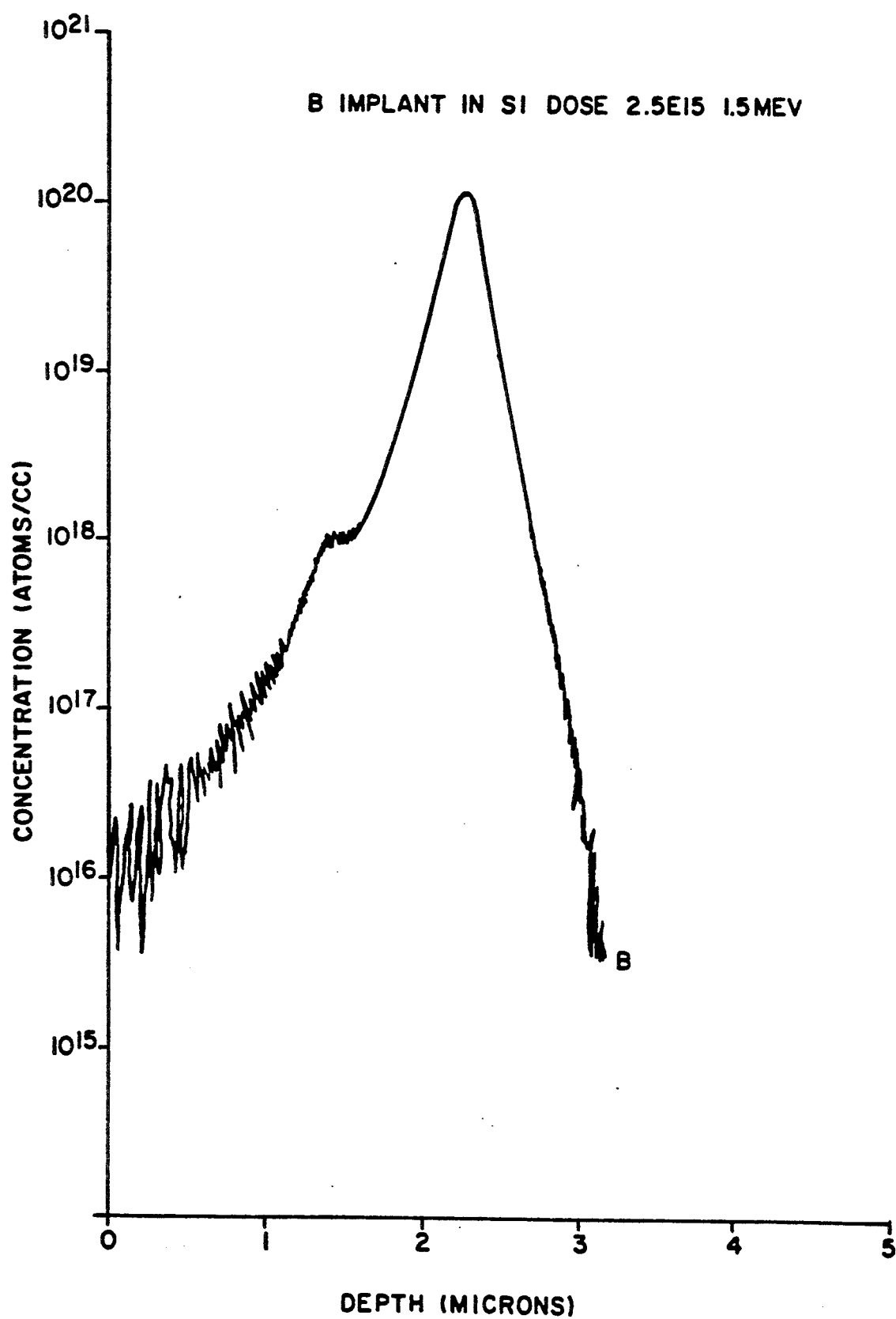
FIG. 3 shows the measured implanted boron distribution in silicon for 1.5 MeV boron with a high beam current dose.

Distinct advantages arise from the use of MeV energy range ions. In FIGS. 2 and 3 the skewed nature of the implanted boron is evident. For example, in the case of the 0.3 MeV boron ion implantation the peak atom concentration is $7 \times 10^{19}$ compared to a surface concentration of $1.5 \times 10^{17}/cm^3$ (a ratio of about five to one). This can be compared to the distribution for 0.8 MeV boron ion implantation where the concentration is $8 \times 10^{19}$ at the peak location of 0.7 micrometers, versus a concentration of $10^{17}/cm^3$ at the surface (a ratio of at least two hundred to one). The same desirable peak shape also results even at high dose levels of $2.5 \times 10^{15}/cm^2$ for 1.5 MeV boron implantation (see FIG. 3). Therefore in the case of 0.8 MeV boron implantation, in order to encounter a boron concentration of at least $5 \times 10^{16}/cm^3$ (and establish an etch back threshold barrier), one must reach a depth of about 0.5 micrometers in the silicon substrate material 10. A similar result occurs for the high beam current case illustrated in FIG. 3. Use of the etch back technique would result in the removal of about 0.5 micrometers of the silicon substrate material 10. As can be deduced from reviewing FIG. 2, the depth of the etch back layer can be readily adjusted by varying the ion implantation energy while avoiding significant boron implantation tails extending to the surface.

Figure 4:
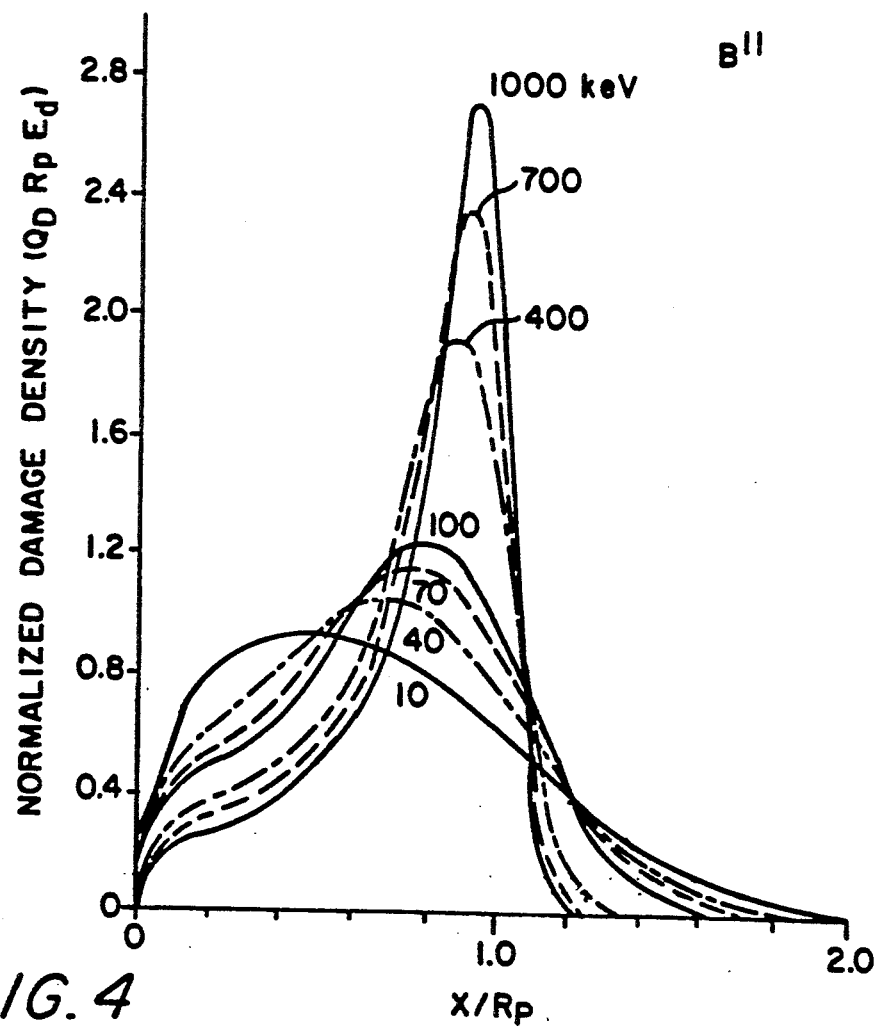
FIG. 4 shows the radiation damage distribution for ion implantation of $B^{11}$ as a function of normalized depth in silicon.

The ion beam implantation damage increases with ion energy (see FIG. 4) and also increases with larger concentrations of implanted dopant. Therefore, the damage level should be kept to a minimum while achieving the desired dopant atom concentration, the necessary profile and the depth for the ion implanted layer 16. Radiation damage effects (see FIG. 4) can also be ameliorated by raising the target silicon substrate material 10 to modest temperatures of roughly two to four hundred degrees Centigrade during the implantation step. Such low temperature annealing is well known and can be used to minimize accumulation of radiation damage. Characterization of the accumulated damage can be performed by various techniques, such as, Rutherford back scattering and cross sectional transmission electron microscopy. These types of characterization can help to establish the optimum standard ranges for the ion implantation variables (for example, the energy, dopant species, concentration of dopant and specimen temperature during implantation).

In order to make the implanted dopant atoms operate as an etch stop barrier, the dopant atoms are made electrically active by annealing the implanted silicon substrate material 10. Such an annealing treatment not only can activate the implanted dopant, but also can be beneficial in reducing the damage accumulated from the ion implantation step. If done after the CVD step of depositing the first oxide 14, the annealing also densifies the first oxide 14. Suitable conventional annealing treatments can remove the extended defects, such as dislocations, in the depth range of one standard deviation of the ion range. Typical annealing treatments of approximately eight to nine hundred degrees Centigrade are adequate to achieve electrical activation of the implanted dopant species, but without causing detrimental thermal diffusion in the silicon substrate material 10. Substantially higher temperatures might lead to thermal profile broadening which would lead to the undesirable result of spreading of dopant atoms into the surface region (which we wish to keep "undoped" as described hereinbefore).

Another applicable annealing technique which can be used to advantage is rapid thermal annealing which is a known method for rapid processing of ion implanted silicon. This annealing method reduces defects and activates the dopant implanted atoms, while minimizing any diffusion profile broadening. Whichever annealing regimen is selected, the multi-purpose nature of the prescribed annealing step yields a process consolidation benefit which is another advantage of the subject invention.

As described hereinbefore the first oxide 14 is preferably formed by CVD or, alternatively can be formed by another conventional process which minimizes the temperature experienced by the silicon substrate material 10. By minimizing the treatment temperature, the narrow profile of the dopant ion implanted layer 16 is maintained. A conventional method of forming the first oxide 14 is by CVD, and for example, CVD can be performed by decomposition of tetraethylorthosilicate or other currently available high deposition rate chemicals. The CVD process can be carried out at a temperature of about six hundred degrees Centigrade and at deposition rates of about 0.05 micrometers per minute. The process can be performed in a standard batch hot wall furnace (not shown) or if particulate improvement is desired later during the manufacturing process, single wafers of the silicon substrate material 10 can be processed using newly available cold wall furnace technology. Both the active silicon substrate material 10 and a passive silicon substrate material 18 (see FIG. 1) can be processed by using CVD to deposit thick layers of oxide. Typical thicknesses for the active silicon substrate material 10 or the passive silicon substrate material 18 can range from roughly 0.05 to 3 micrometers.

The thickness of the first oxide 14 can vary depending on the desired structure and other considerations, such as, minimizing thermal broadening of the dopant ion implanted layer 16. This thermal broadening can be diminished by depositing a minimal thickness of the first oxide 14. Densification of the first oxide 14 can be carried out at about nine hundred degrees Centrigrade for twenty minutes in an oxygen atmosphere or can be done in a forming gas atmosphere if one chooses to incorporate hydrogen for functional purposes. As discussed hereinbefore, such a treatment also serves as a process consolidation step by annealing out substantial defects and electrically activating the dopant atoms.

The next step illustrated in the preferred process of FIG. 1 is directed to bonding of the first deposited oxide 14 to a second deposited oxide 20. The second oxide 20 is deposited by CVD on the passive silicon substrate material 18. The bonding of these two deposited oxides 14 and 20 can be accomplished in various ways. The preferred method is by CVD of thin borophosphosilicate glass layers which can flow at about eight hundred fifty degrees Centigrade and bond the first oxide 14 to the second deposited oxide 20. This step is followed by a densification step in a wet oxygen atmosphere to add OH molecules to the surfaces and then performing a cleaning/passivating step in $NH_4OH$. The surface can also be activated by implantation of hydrogen in a conventional manner.

The next major process step is the etch back step for removing a defective portion of the silicon substrate material 10. As described hereinbefore, this technique allows ready removal of a precise amount of the silicon substrate material 10, with the etch process ceasing upon encountering the dopant ion implanted layer 16. In the case of the implanted dopant being boron as illustrated in FIG. 1, the etchant used is ethylenediamine ($NH_2$ ($Ch_2$)—pyrocatechol ($C_6H_4(OH)_2$), or EDP, which has well known etch stop characteristics. The etching process typically proceeds at a rate of several tenths of a micron per minute. It is well known that EDP etch processing produces optically flat silicon surfaces without pitting or roughening of the surface. The uniformity of the layer of the silicon substrate material 10 after EDP etching is determined by the uniformity of the dopant ion implanted layer 16. Control of the uniformity of this dopant layer 16 is well known and involves the control of the ion energy spread and ion implantation channeling effects. Optionally, one can mechanically or chemically pre-thin the silicon substrate material 10 if it is relatively thick, followed by the etch back step. The pre-thinned form of the silicon substrate material 10 is commercially available from Virginia Semiconductors, Arlington, Va.

After the EDP etch stop process has been completed, another etch stop procedure is carried out to selectively remove the dopant ion implanted layer 16, leaving the high quality silicon layer 22. In the case of a boron implanted dopant, the etch is typically a conventional mixture of HF, $HNO_3$ and acetic acid. Provided the etch is selective enough, there will be no need to monitor the etch rate. Elimination of thickness measurements provides a further commercial benefit to the invention by reducing the manufacturing cost and acceleration of the production rate.

In the preferred embodiment, the remaining thickness of the silicon substrate material 10 is measured by conventional means, such as by ellipsometry or other optical inteferometric or reflectance spectroscopic techniques. In order to remove small additional thickness from the silicon substrate material 10, an etch of boiling water and HF can be used.

In another form of the invention an additional oxide layer can be grown onto the silicon substrate material 10 after the usual etch back step (which removes a defective portion of the silicon substrate material 10), and before removal of the dopant ion implanted layer 16. Such a grown oxide layer 30 (shown in phantom in FIG. 1) can be formed by a wet oxygen treatment at roughly 200° C. to 900° C. In addition to forming the oxide layer 30, the boron is preferentially drawn into the grown oxide layer 30. This grown oxide 30 can then be removed by an HF etch step, leaving exposed the high quality silicon layer 22.

In the preceding description of the preferred embodiment, a method of preparation is set forth with a particular order for the method steps. In alternate embodiments certain of these steps can be performed in a different order and not affect the Production of the desired end product, a high quality silicon on insulator structure. For example, before implanting the dopant ions into the silicon substrate material 10, the steps of forming deposited oxides on silicon substrate materials and coupling the two deposited oxides together can be done first. Further rearrangement of the steps is also possible as long as substantive defects are not accumulated (which cannot be readily removed) in the active silicon substrate material 10.

While preferred embodiments of the present invention have been illustrated and described, it will be understood that changes and modifications can be made without departing from the invention in its broader aspects. Various features of the invention are set forth in the following claims.

What is claimed is:

1. A layered silicon on insulator structure, comprising:
    a silicon substrate material comprised of uncompensated silicon with a dopant concentration less than $5\times 10^{16}/cm^2$ including a narrow peak profile of MeV energy range implanted dopant atoms disposed adjacent the exposed surface of said silicon substrate material, said exposed surface having a smooth finish associated with chemical etch stop removal of the radiation damaged portion of said silicon substrate material up to said narrow peak profile of said implanted dopant atoms;
    a first insulator layer coupled to said silicon substrate material;
    a second insulator layer coupled to said first insulator layer; and
    a passive silicon substrate material coupled to said second insulator layer.

2. A layered silicon on insulator structure for use as a starting material for an integrated circuit, comprising:
    an uncompensated silicon substrate material having a thickness less than about 3 microns, a dislocation density less than about $2/cm^2$ and a dopant concentration less than about $5\times 10^{16}/cm^3$;
    a first insulator layer coupled to said silicon substrate material;
    a second insulator layer coupled to said first insulator layer; and
    a passive silicon substrate material coupled to said second insulator layer.

3. A layered silicon on insulator structure for use as a starting material for an integrated circuit, comprising:
    an uncompensated silicon substrate material having a dislocation density less than about $2/cm^2$ and a dopant concentration less than about $5\times 10^{16}/cm^3$, said silicon material having a smooth exposed surface associated with preferential chemical etch removal of an ion implantation damaged layer and chemical removal of another layer containing MeV energy range implanted dopant atoms;
    a first insulator layer coupled to said silicon substrate material;
    a second insulator layer coupled to said first insulator layer; and
    a passive silicon substrate material coupled to said second insulator layer.

4. The layered silicon on insulator structure as defined in claim 3 wherein said dopant atoms are selected from the group consisting of Li, P, As, Sb, Bi, B, Al, Ga, In and Tl.

5. The layered silicon on insulator structure as defined in claim 3 further including a quality oxide layer disposed between said silicon substrate material and said first insulator layer.

6. The layered silicon on insulator structure as defined in claim 3 wherein oxygen contamination is less than about 14 ppm in said silicon substrate material.

7. The layered silicon on insulator structure as defined in claim 3 wherein carbon contamination is less than about 0.5 ppm in said silicon substrate material.

8. A layered silicon on insulator structure, comprising:
    a high quality silicon layer comprised of an uncompensated silicon layer of thickness less than about 0.05-3 μm and having an exposed surface created by implanting a narrow peak profile of MeV energy range dopant atoms into a silicon substrate material and removing layers of said silicon substrate material by chemical etch stop removal steps, leaving said high quality silicon layer having a dislocation density not more than said silicon substrate material; and
    an insulator substrate coupled to said high quality silicon layer to form said layered silicon on insulator structure.

9. The layered silicon on insulator structure as defined in claim 8 wherein said dislocation density is less than $2/cm^2$.

10. The layered silicon on insulator structure as defined in claim 8 wherein said uncompensated silicon layer has less than about $5\times 10^{16}/cm^3$ dopants.

* * * * *

UNITED STATES PATENT AND TRADEMARK OFFICE
CERTIFICATE OF CORRECTION

PATENT NO. : 5,136,344
DATED : August 4, 1992
INVENTOR(S) : Peter P. Pronko

It is certified that error appears in the above-identified patent and that said Letters Patent is hereby corrected as shown below:

Column 3, Line 19, cancel "Peak" and insert -- peak --;

Column 3, Line 32, before "implanted" insert -- ion --;

Column 6, Line 52, cancel "Production" and insert --- production --;

Column 7, Line 23, before "3 microns" insert -- 0.5- --.

Signed and Sealed this

Seventh Day of December, 1993

Attest:

BRUCE LEHMAN

Attesting Officer — Commissioner of Patents and Trademarks